(12) United States Patent
Nakagawa (10) Patent No.: US 11,081,884 B2
(45) Date of Patent: Aug. 3, 2021

(54) SEMICONDUCTOR DEVICE (71) Applicant: FUJI ELECTRIC CO., LTD., Kawasaki (JP)

(72) Inventor: Sho Nakagawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/883,282

(22) Filed: May 26, 2020

(65) Prior Publication Data

US 2021/0021125 A1    Jan. 21, 2021

(30) Foreign Application Priority Data

Jul. 16, 2019 (JP) .............................. JP2019-130855

(51) Int. Cl.
| | | |
|---|---|---|
| *H02J 1/10* | (2006.01) | |
| *H03K 17/082* | (2006.01) | |
| *H03K 17/06* | (2006.01) | |
| *H03K 17/08* | (2006.01) | |

(52) U.S. Cl.
CPC ............ *H02J 1/106* (2020.01); *H03K 17/063* (2013.01); *H03K 17/0822* (2013.01); *H03K 2017/0806* (2013.01)

(58) Field of Classification Search
CPC .... H02J 1/00; H02J 1/106; H02J 3/14; H02M 2001/00; H02M 2001/009; H02M 3/00; H02M 3/33561; H03K 17/00; H03K 17/063; H03K 17/0822; H03K 2017/00;

(Continued)

(56) References Cited

U.S. PATENT DOCUMENTS

| | | | |
|---|---|---|---|
| 5,483,404 A | 1/1996 | Nakano | |
| 2009/0002055 A1* | 1/2009 | Kojima | ................ H03K 17/063 327/434 |

FOREIGN PATENT DOCUMENTS

| | | |
|---|---|---|
| JP | H08-83909 A | 3/1996 |
| JP | 2000-339025 A | 12/2000 |
| JP | 2000-341995 A | 12/2000 |

(Continued)

OTHER PUBLICATIONS

Yuka Morisawa et al., "High-Side 2-in-1 IPS "F5114H" for Automobiles", Fuji Electric Review, vol. 62, No. 4, Dec. 30, 2016.

*Primary Examiner* — Lincoln D Donovan
*Assistant Examiner* — Dave Mattison
(74) *Attorney, Agent, or Firm* — Rabin & Berdo, P.C.

(57) ABSTRACT

A semiconductor device having a power source terminal, a ground terminal, an input terminal, an output terminal and a status output terminal. The semiconductor device includes a power semiconductor switch connected between the power source terminal and the output terminal, a logic circuit connected to the power semiconductor switch, and a ground terminal opening detection circuit connected to the ground terminal and the status output terminal. The logic circuit is configured to generate, according to a signal inputted to the input terminal, an output logic signal for turning on or off the power semiconductor switch. The ground terminal opening detection circuit is configured to detect a state in which the ground terminal is opened, based on a rise in a potential of the ground terminal, and to output, via the status output terminal, a detection signal in response to the detection of the state.

8 Claims, 10 Drawing Sheets

(58) Field of Classification Search
CPC ............ H03K 2017/0806; Y02B 70/00; Y02B 70/3225
USPC ......................................................... 307/31
See application file for complete search history.

(56) References Cited

FOREIGN PATENT DOCUMENTS

| | | |
|---|---|---|
| JP | 2000-341996 A | 12/2000 |
| JP | 2009-010477 A | 1/2009 |
| JP | 2016200506 A * | 12/2016 |

* cited by examiner

| MODE | IN | ST | OUT | ST2 |
|---|---|---|---|---|
| NORMAL OPERATION | L<br>H | L<br>H | L<br>H | H<br>H |
| LOAD OPENING | L | H | H | H |
| GND TERMINAL OPENING | L/H | H | L | L |

| MODE | IN | ST | OUT | ST2 |
|---|---|---|---|---|
| NORMAL OPERATION | L<br>H | L<br>H | L<br>H | L<br>L |
| LOAD OPENING | L | H | H | L |
| GND TERMINAL OPENING | L/H | H | L | H |
| GND2 TERMINAL OPENING | L<br>H | L<br>H | L<br>H | H<br>H |

| MODE | IN | ST | OUT | ST2 |
|---|---|---|---|---|
| NORMAL OPERATION | L<br>H | L<br>H | L<br>H | H<br>H |
| LOAD OPENING | L | H | H | H |
| GND TERMINAL OPENING | L/H | H | L | L |

| MODE | IN | ST | OUT |
|---|---|---|---|
| NORMAL OPERATION | L<br>H | L<br>H | L<br>H |
| LOAD OPENING | L | H | H |

Related Art
FIG. 10

SEMICONDUCTOR DEVICE

CROSS-REFERENCE TO RELATED APPLICATION

This application is based upon and claims the benefit of priority of the prior Japanese Patent Application No. 2019-130855, filed on Jul. 16, 2019, the entire contents of which are incorporated herein by reference.

BACKGROUND OF THE INVENTION

1. Field of the Invention

The embodiments discussed herein relate to a semiconductor device which performs switching of the supply of power to a load.

2. Background of the Related Art

Many semiconductor devices which exercise switching control of a load, such as a motor, are mounted in motor vehicles. An intelligent power switch (IPS) is used as such an in-vehicle semiconductor device. With an IPS, a power semiconductor switch which supplies power to a load and its control circuit are integrated onto the same chip. With such an IPS, usually an n-channel metal-oxide-semiconductor field-effect transistor (MOSFET) having low on-state resistance per unit area is used as a power semiconductor switch.

Figure 9:
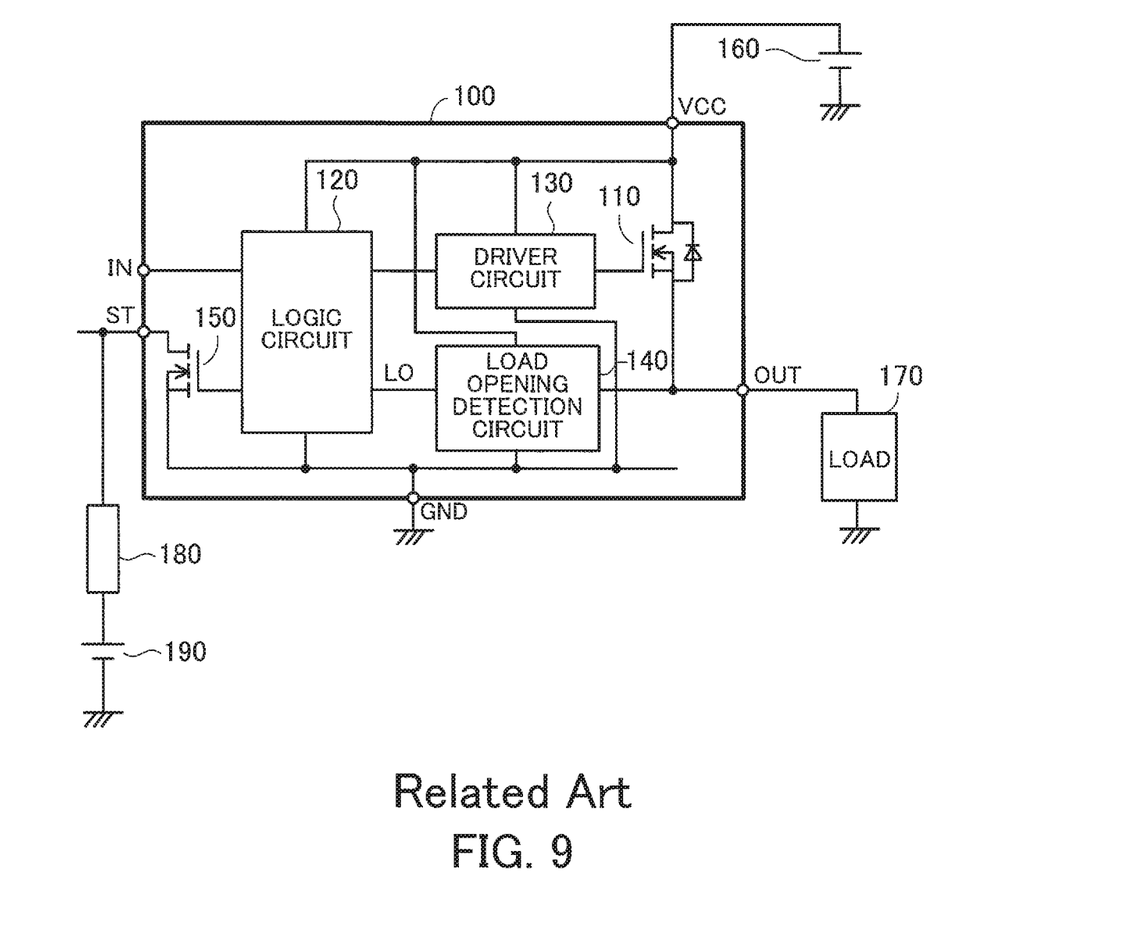
FIG. 9 illustrates an example of the structure of a conventional IPS.
Figure 10:
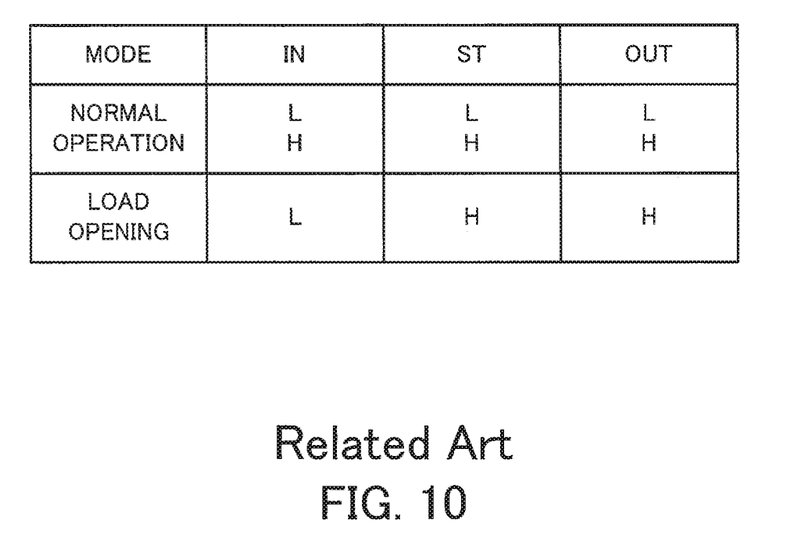
FIG. 10 is a logic table illustrative of the operation of the conventional IPS.

FIG. 9 illustrates an example of the structure of a conventional IPS. FIG. 10 is a logic table illustrative of the operation of the conventional IPS. In the description of FIG. 9, the same numeral may be used for representing the name of a terminal and a voltage, a signal, or the like at the terminal.

As illustrated in FIG. 9, a conventional IPS 100 includes a main MOSFET 110, a logic circuit 120, and a driver circuit 130 and includes a load opening detection circuit 140 and an n-channel MOSFET 150 for status notification as a state detection function. Furthermore, the IPS 100 has an IN terminal, a VCC terminal, an OUT terminal, a GND terminal, and an ST terminal.

The IN terminal of the IPS 100 is connected to an input terminal of the logic circuit 120 and an output terminal of the logic circuit 120 is connected to an input terminal of the driver circuit 130. An output terminal of the driver circuit 130 is connected to a gate terminal of the main MOSFET 110. A drain terminal of the main MOSFET 110, a power source terminal of the logic circuit 120, and a power source terminal of the driver circuit 130 are connected to the VCC terminal. The VCC terminal is connected to a positive electrode terminal of a battery 160 which supplies a voltage VCC, and a negative electrode terminal of the battery 160 is connected to a chassis of a motor vehicle. A source terminal of the main MOSFET 110 is connected to the OUT terminal and the OUT terminal is connected to one terminal of a load 170. The other terminal of the load 170 is connected to the chassis of the motor vehicle. A low potential side terminal of the logic circuit 120 and a low potential side terminal of the driver circuit 130 are connected to the GND terminal.

The OUT terminal is also connected to an input terminal of the load opening detection circuit 140 and an output terminal of the load opening detection circuit 140 is connected to a terminal of the logic circuit 120 to which a load opening detection signal LO is inputted. Furthermore, a power source terminal of the load opening detection circuit 140 is connected to the VCC terminal and a low potential side terminal of the load opening detection circuit 140 is connected to the GND terminal. In addition, the logic circuit 120 is connected to a gate terminal of the MOSFET 150 and a drain terminal of the MOSFET 150 is connected to the ST terminal. A source terminal of the MOSFET 150 is connected to the GND terminal.

The IN terminal and the ST terminal of the IPS 100 are connected to a control-oriented microcomputer and a signal for on-off controlling the main MOSFET 110 is inputted to the IN terminal. For example, a 5-volt high(H)-level logic signal is inputted as an on-control signal and a 0-volt low(L)-level logic signal is inputted as an off-control signal. Furthermore, for example, the ST terminal is connected via an external resistor 180 to a 5-volt external power source 190 and is pulled up to a voltage of 5 volts.

As illustrated in FIG. 10, the following operation is performed when the IPS 100 normally operates. When an L-level input logic signal is inputted to the IN terminal, the main MOSFET 110 is off-controlled. Accordingly, the OUT terminal is at an L level. At this time, the logic circuit 120 supplies an H-level signal to the gate terminal of the MOSFET 150 and the MOSFET 150 is on-controlled. Therefore, the ST terminal is at an L level.

When the IPS 100 normally operates and an H-level input logic signal is inputted to the IN terminal, the main MOSFET 110 is on-controlled and the voltage VCC is applied to the OUT terminal. As a result, the OUT terminal becomes an H level. At this time, the logic circuit 120 supplies an L-level signal to the gate terminal of the MOSFET 150 and the MOSFET 150 is off-controlled. Therefore, the ST terminal becomes an H level.

Next, when an L-level input logic signal is inputted to the IN terminal of the IPS 100 and the load opening detection circuit 140 detects a load opening, the OUT terminal becomes an H level. That is to say, when the load 170 is opened, the potential of the OUT terminal is not decreased by the load 170. As a result, the OUT terminal becomes an H level. At this time, the logic circuit 120 supplies an L-level signal to the gate terminal of the MOSFET 150 and the MOSFET 150 is off-controlled. Therefore, the ST terminal becomes an H level. When the main MOSFET 110 is off-controlled and the H level at the ST terminal is detected, the microcomputer determines that the load 170 is in an opened state.

With the IPS 100 the load opening detection circuit 140 detects the state of the OUT terminal in which the load 170 is opened. However, the GND terminal may also be opened due to peeling of a solder bonding portion or the like. If the GND terminal is opened, formerly a main power semiconductor switch was off-controlled regardless of a logic level at the IN terminal (see, for example, Japanese Laid-open Patent Publication No. 2009-10477).

However, the function of informing a microcomputer of a GND terminal opening abnormality is also demanded for recent IPSs. If an IPS informs a microcomputer of an opened state of a GND terminal, then the microcomputer recognizes an abnormality in the IPS in advance and takes a proper countermeasure.

With the conventional IPS a signal outputted to the ST terminal becomes an H level only when an H-level input logic signal is inputted to the IN terminal at normal operation time and when an L-level input logic signal is inputted to the IN terminal and a load opening is detected. Accordingly, if an H-level signal is outputted to the ST terminal when the GND terminal is opened, then the microcomputer fails to determine whether the H-level signal is outputted due to a load opening or a GND terminal opening.

SUMMARY OF THE INVENTION

According to an aspect, there is provided a semiconductor device having a power source terminal, a ground terminal, an input terminal, an output terminal and a status output terminal. The semiconductor device includes: a power semiconductor switch connected between the power source terminal and the output terminal; a logic circuit connected to the power semiconductor switch, the logic circuit being configured to generate, according to a signal inputted to the input terminal, an output logic signal for turning on or off the power semiconductor switch; and a ground terminal opening detection circuit connected to the ground terminal and the status output terminal, the ground terminal opening detection circuit being configured to detect a state in which the ground terminal is opened, based on a rise in a potential of the ground terminal, and to output, via the status output terminal, a detection signal in response to the detection of the state.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

A semiconductor device according to an embodiment will now be described in detail with reference to the drawings with a case where it is applied to an IPS which turns on and off a vehicle electrical component as an example. Components in the accompanying drawings marked with the same numerals are the same components. Furthermore, in the following description the same numeral may be used for representing the name of a terminal and a voltage, a signal, or the like at the terminal.

Figure 1:
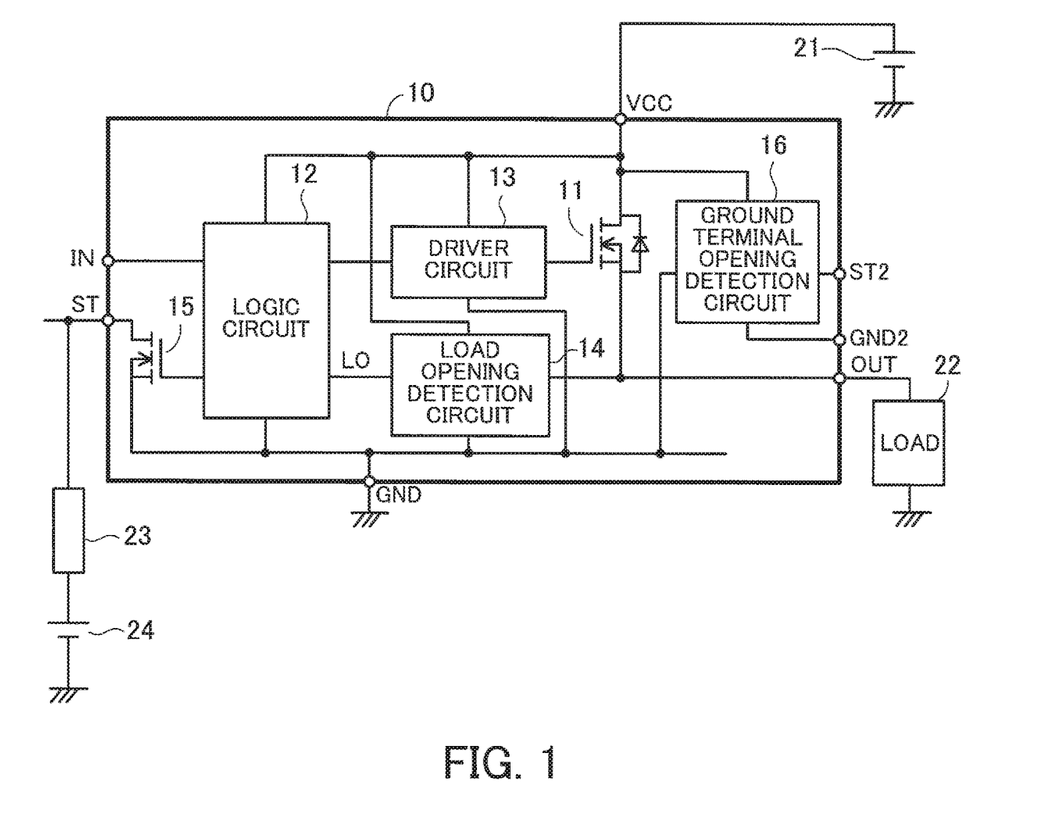
FIG. 1 illustrates an example of the structure of an IPS according to a first embodiment.
Figure 2:
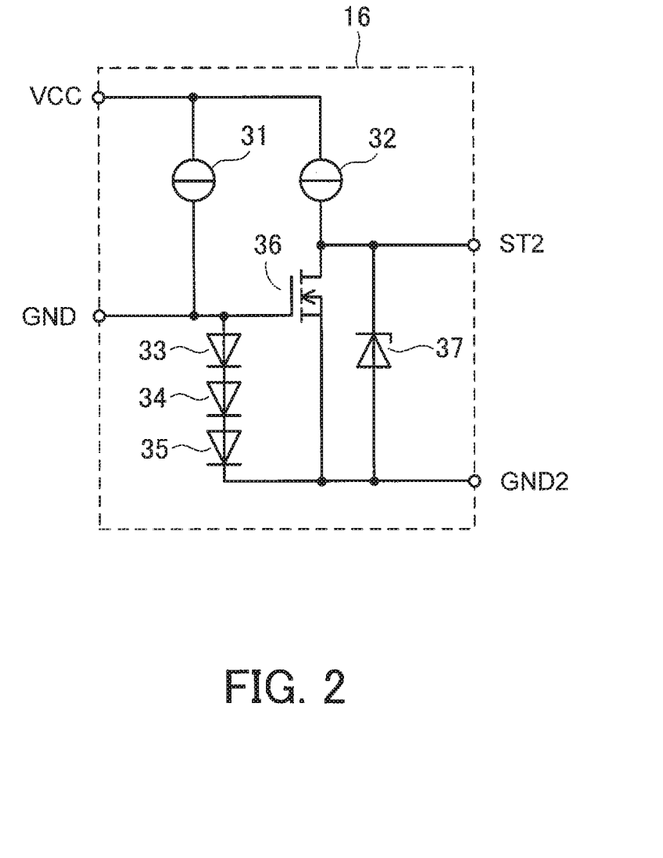
FIG. 2 is a circuit diagram illustrative of an example of the structure of a ground terminal opening detection circuit in the IPS according to the first embodiment.
Figure 3:
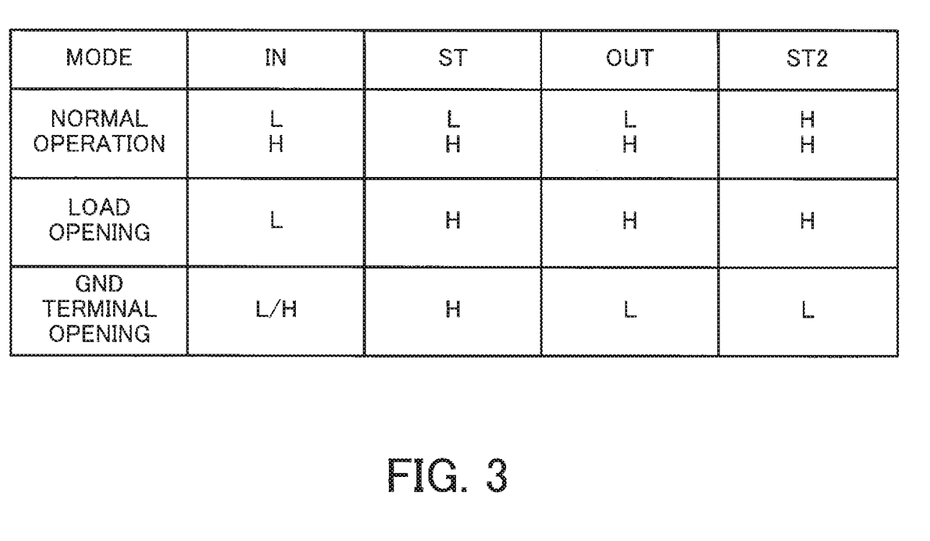
FIG. 3 is a logic table illustrative of the operation of the IPS according to the first embodiment.

FIG. 1 illustrates an example of the structure of an IPS according to a first embodiment. FIG. 2 is a circuit diagram illustrative of an example of the structure of a ground terminal opening detection circuit in the IPS according to the first embodiment. FIG. 3 is a logic table illustrative of the operation of the IPS according to the first embodiment.

As illustrated in FIG. 1, an IPS 10 includes a main MOSFET 11 which is a power semiconductor switch, a logic circuit 12, and a driver circuit 13 and includes a load opening detection circuit 14, a MOSFET 15, and a ground terminal opening detection circuit 16 as a state detection function. Furthermore, the IPS 10 has an IN terminal, a VCC terminal, an OUT terminal, a GND terminal, an ST terminal, an ST2 terminal, and a GND2 terminal.

The IN terminal of the IPS 10 is connected to an input terminal of the logic circuit 12 and an output terminal of the logic circuit 12 is connected to an input terminal of the driver circuit 13. An output terminal of the driver circuit 13 is connected to a gate terminal of the main MOSFET 11. A drain terminal of the main MOSFET 11, a power source terminal of the logic circuit 12, and a power source terminal of the driver circuit 13 are connected to the VCC terminal. The VCC terminal is connected to a positive electrode terminal of a battery 21 which supplies a voltage VCC, and a negative electrode terminal of the battery 21 is connected to a chassis of a motor vehicle. A source terminal of the main MOSFET 11 is connected to the OUT terminal and the OUT terminal is connected to one terminal of a load 22. The other terminal of the load 22 is connected to the chassis of the motor vehicle. A low potential side terminal of the logic circuit 12 and a low potential side terminal of the driver circuit 13 are connected to the GND terminal.

The OUT terminal is also connected to an input terminal of the load opening detection circuit 14 and an output terminal of the load opening detection circuit 14 is connected to a terminal of the logic circuit 12 to which a load opening detection signal LO is inputted. Furthermore, a power source terminal of the load opening detection circuit 14 is connected to the VCC terminal and a low potential side terminal of the load opening detection circuit 14 is connected to the GND terminal. In addition, the logic circuit 12 is connected to a gate terminal of the n-channel MOSFET 15 for status notification and a drain terminal of the MOSFET 15 is connected to the ST terminal. A source terminal of the MOSFET 15 is connected to the GND terminal.

Moreover, the VCC terminal is connected to a power source terminal of the ground terminal opening detection circuit 16. An input terminal of the ground terminal opening detection circuit 16 is connected to the GND terminal and an output terminal of the ground terminal opening detection circuit 16 is connected to the ST2 terminal and the GND2 terminal. The ST2 terminal is a status output terminal and the GND2 terminal is a second ground terminal.

The IN terminal, the ST terminal, the ST2 terminal, and the GND2 terminal of the IPS 10 are connected to a control-oriented microcomputer and an L- or H-level input logic signal for on-off controlling the main MOSFET 11 is inputted to the IN terminal from the microcomputer. Furthermore, the ST terminal is connected via an external resistor 23 to an external power source 24. The voltage of the external power source 24 is, for example, 5 V. Accordingly, the ST terminal is used in a state in which it is pulled up to a voltage of 5 volts. The GND2 terminal is the second ground terminal other than the GND terminal and is connected to a GND terminal of the microcomputer (to the negative electrode terminal of the battery 21).

As illustrated in FIG. 2, the ground terminal opening detection circuit 16 includes constant-current circuits 31 and 32, diodes 33, 34, and 35, a MOSFET 36, and a Zener diode 37. The MOSFET 36 is a switching element for ground terminal opening detection and is an n-channel MOSFET.

One terminal of the constant-current circuit 31 is connected to a voltage VCC line and the other terminal of the constant-current circuit 31 is connected to the GND terminal, an anode terminal of the diode 33, and a gate terminal of the MOSFET 36. A cathode terminal of the diode 33 is connected to an anode terminal of the diode 34, a cathode terminal of the diode 34 is connected to an anode terminal of the diode 35, and a cathode terminal of the diode 35 is connected to the GND2 terminal.

One terminal of the constant-current circuit 32 is connected to the voltage VCC line and the other terminal of the constant-current circuit 32 is connected to a drain terminal of the MOSFET 36 and the ST2 terminal. A source terminal of the MOSFET 36 is connected to the GND2 terminal.

The Zener diode 37 is connected in parallel with the MOSFET 36. That is to say, the drain terminal of the MOSFET 36 is connected to a cathode terminal of the Zener diode 37 and the source terminal of the MOSFET 36 is connected to an anode terminal of the Zener diode 37.

The constant-current circuit 31 is a pull-up circuit. That is to say, when the GND terminal is opened, the constant-current circuit 31 pulls up the potential of the GND terminal. Accordingly, if the IPS 10 includes an internal circuit which pulls up the potential of the GND terminal, then the internal circuit may be used in place of the constant-current circuit 31.

The diodes 33, 34, and 35 are used for gate protection. That is to say, when the GND terminal is opened, a voltage at the GND terminal becomes unstable and the gate-source voltage of the MOSFET 36 abnormally rises. This leads to destruction. The diodes 33, 34, and 35 are used for protecting the MOSFET 36 against such destruction. The sum of the forward voltages of the diodes 33, 34, and 35 is set to a value greater than a threshold voltage at which the MOSFET 36 turns on. For example, the sum of the forward voltages of the diodes 33, 34, and 35 is set to about 2 V.

The Zener diode 37 is used for generating from the voltage VCC a 5-volt logic signal as a detection signal of a GND terminal opening. Accordingly, a Zener diode having a breakdown voltage of 5 volts is used as the Zener diode 37.

With the IPS 10 including the ground terminal opening detection circuit 16 having the above structure, as illustrated in FIG. 3, the main MOSFET 11 is off-controlled when an L-level input logic signal is inputted to the IN terminal at the time of the normal operation of the IPS 10. Accordingly, the OUT terminal is at an L level. At this time, the logic circuit 12 supplies an H-level signal to a gate terminal of the MOSFET 15 and the MOSFET 15 is on-controlled. Therefore, the ST terminal is at an L level. In the ground terminal opening detection circuit 16, the potential of the GND terminal is 0 V and the MOSFET 36 for GND terminal opening detection is off-controlled. As a result, the ST2 terminal is at an H level.

When an H-level input logic signal is inputted to the IN terminal at the time of the normal operation of the IPS 10, the main MOSFET 11 is on-controlled and the voltage VCC is applied to the OUT terminal. As a result, the OUT terminal becomes an H level. At this time, the logic circuit 12 supplies an L-level signal to the gate terminal of the MOSFET 15 and the MOSFET 15 is off-controlled. Therefore, the ST terminal becomes an H level. In the ground terminal opening detection circuit 16, the potential of the GND terminal is 0 V and the MOSFET 36 is off-controlled. As a result, the ST2 terminal remains at the H level.

Next, when an L-level input logic signal is inputted to the IN terminal of the IPS 10 and the load opening detection circuit 14 detects a load opening, the OUT terminal becomes an H level because a decrease in potential by the load 22 does not take place. At this time, the logic circuit 12 supplies an L-level signal to the gate terminal of the MOSFET 15 and the MOSFET 15 is off-controlled. Therefore, the ST terminal becomes an H level. In the ground terminal opening detection circuit 16, the potential of the GND terminal is 0 V and the MOSFET 36 is off-controlled. As a result, the ST2 terminal remains at the H level.

Next, when the GND terminal is opened, the potential of the gate terminal of the MOSFET 36 included in the ground terminal opening detection circuit 16 is pulled up by the constant-current circuit 31. As a result, the MOSFET 36 is on-controlled. Accordingly, the Zener diode 37 is short-circuited by the MOSFET 36 and the ST2 terminal becomes an L level. At this time the logic circuit 12 does not normally operate because the GND terminal is floating. Therefore, the main MOSFET 11 is put into an off state regardless of a level of a signal at the IN terminal and the OUT terminal becomes an L level. Furthermore, the logic circuit 12 makes the gate terminal of the MOSFET 15 an L level to put the MOSFET 15 into an off state. As a result, the ST terminal is pulled up by the external power source 24 and becomes an H level. In this case, the ST terminal is at the H level. This is the same with the case where the load opening is detected. However, the ST2 terminal is at the H level at the time of the load opening being detected and is at the L level at the time of the GND terminal opening being detected. As a result, the microcomputer is capable of making a distinction between the load opening and the GND terminal opening and identify the GND terminal opening.

Figure 4:
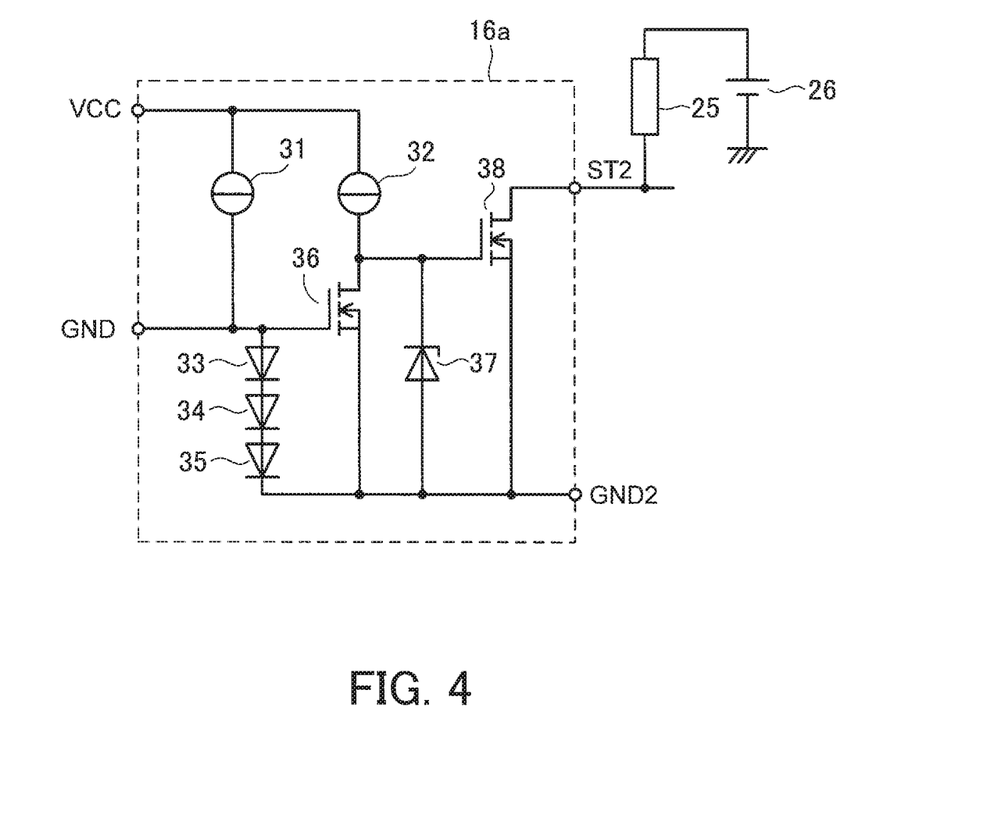
FIG. 4 is a circuit diagram illustrative of an example of the structure of a ground terminal opening detection circuit in an IPS according to a second embodiment.
Figure 5:
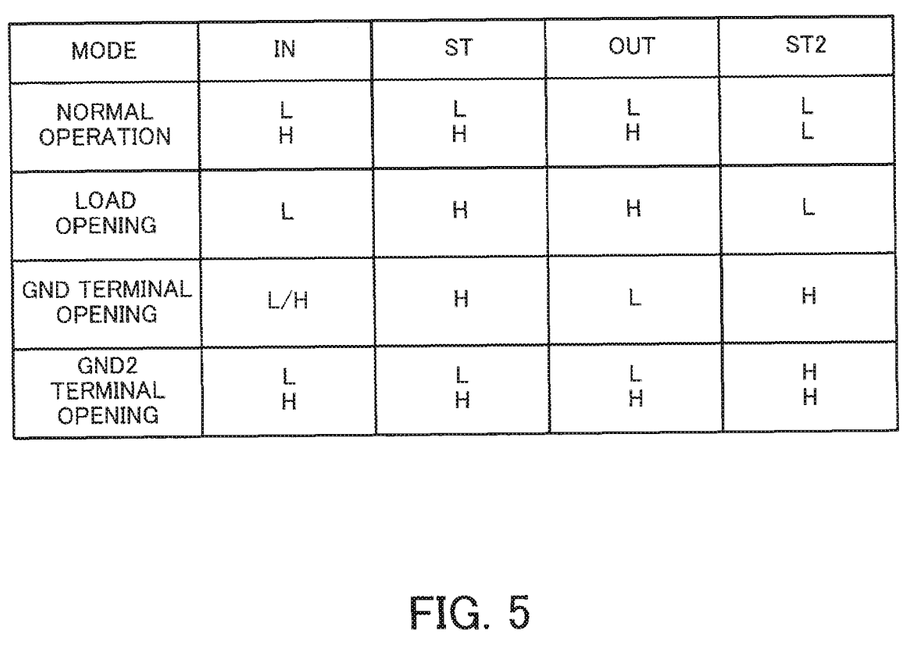
FIG. 5 is a logic table illustrative of the operation of the IPS according to the second embodiment.

FIG. 4 is a circuit diagram illustrative of an example of the structure of a ground terminal opening detection circuit in an IPS according to a second embodiment. FIG. 5 is a logic table illustrative of the operation of the IPS according to the second embodiment. The structure of the IPS according to the second embodiment is the same as that illustrated in FIG. 1. Furthermore, components in FIG. 4 which are the same as or equivalent to those illustrated in FIG. 2 are marked with the same numerals and detailed descriptions of them will be omitted.

The IPS 10 according to the first embodiment detects only the GND terminal opening. On the other hand, the IPS according to the second embodiment also detects a GND2 terminal opening.

As illustrated in FIG. 4, a ground terminal opening detection circuit 16a in the second embodiment includes constant-current circuits 31 and 32, diodes 33, 34, and 35, a MOSFET 36, a Zener diode 37, and a MOSFET 38. The MOSFET 38 is an n-channel MOSFET for status notification.

Connections in the ground terminal opening detection circuit 16a are made in the following way. The connection point of the other terminal of the constant-current circuit 32, a drain terminal of the MOSFET 36, and a cathode terminal of the Zener diode 37 is connected to a gate terminal of the MOSFET 38. A drain terminal of the MOSFET 38 is connected to an ST2 terminal. A source terminal of the MOSFET 38 is connected to a GND2 terminal.

The ST2 terminal of the ground terminal opening detection circuit 16a is used by connecting an external pull-up power source. This is the same with an ST terminal. That is to say, the ST2 terminal is connected to one terminal of an external resistor 25 and the other terminal of the external resistor 25 is connected to a positive electrode terminal of an external power source 26. A negative electrode terminal of the external power source 26 is connected to a GND terminal of a microcomputer. The voltage of the external power source 26 is, for example, 5 V. Accordingly, the ST2 terminal is pulled up to a voltage of 5 volts.

With the IPS including the ground terminal opening detection circuit 16a having the above structure, as illustrated in FIG. 5, an OUT terminal and the ST terminal are at an L level when an L-level input logic signal is inputted to an IN terminal at the time of the normal operation of the IPS. In the ground terminal opening detection circuit 16a, the potential of a GND terminal is 0 V, the MOSFET 36 is off-controlled, and the MOSFET 38 is on-controlled. As a result, the ST2 terminal is at an L level.

When an H-level input logic signal is inputted to the IN terminal at the time of the normal operation of the IPS, the OUT terminal and the ST terminal are at an H level. In the ground terminal opening detection circuit 16a, the potential of the GND terminal is 0 V, the MOSFET 36 is off-controlled, and the MOSFET 38 is on-controlled. As a result, the ST2 terminal remains at the L level.

Next, when an L-level input logic signal is inputted to the IN terminal of the IPS and a load opening detection circuit 14 detects a load opening, the OUT terminal and the ST terminal are at an H level. In the ground terminal opening detection circuit 16a, the potential of the GND terminal is 0 V, the MOSFET 36 is off-controlled, and the MOSFET 38 is on-controlled. As a result, the ST2 terminal remains at the L level.

Next, when the GND terminal is opened, the potential of the gate terminal of the MOSFET 36 included in the ground terminal opening detection circuit 16a is pulled up by the constant-current circuit 31. As a result, the MOSFET 36 is on-controlled and the MOSFET 38 is off-controlled. Accordingly, the ST2 terminal is pulled up by the external power source 26 and becomes an H level. At this time the logic circuit 12 does not normally operate because the GND terminal is floating. Therefore, a main MOSFET 11 is put into an off state regardless of a level of a signal at the IN terminal and the OUT terminal becomes an L level. Furthermore, the logic circuit 12 makes a gate terminal of a MOSFET 15 an L level to put the MOSFET 15 into an off state. As a result, the ST terminal is pulled up by an external power source 24 and becomes an H level. When the GND terminal is opened, the ST terminal becomes the H level in this way. This is the same with the case where the load opening is detected. However, the ST2 terminal is at the L level at the time of the load opening being detected and is at the H level at the time of the GND terminal opening being detected. As a result, the microcomputer is capable of making a distinction between the load opening and the GND terminal opening and recognize the GND terminal opening.

Operation performed at the time of the GND terminal being normally connected and the GND2 terminal being opened will now be described. Because at this time the GND terminal is normally connected, logics at the IN terminal, the ST terminal, and the OUT terminal are the same as those at the IN terminal, the ST terminal, and the OUT terminal at the normal operation time. However, when the GND2 terminal is opened, the ST2 terminal is pulled up by the external power source 26 and becomes an H level, regardless of on-off control of the MOSFET 38. When the IPS normally operates and the IN terminal is at the H level or when the IN terminal is at the L level and the load opening detection circuit 14 detects the load opening, the ST terminal and the OUT terminal are at the H level. This is the same with the case where the GND2 terminal is opened. However, the ST2 terminal is at the L level when the IPS normally operates or when the IN terminal is at the L level and the load opening detection circuit 14 detects the load opening. On the other hand, the ST2 terminal is at the H level when the GND2 terminal is opened. As a result, the microcomputer is capable of making a distinction between the load opening and the GND2 terminal opening and recognize the GND2 terminal opening.

Figure 6:
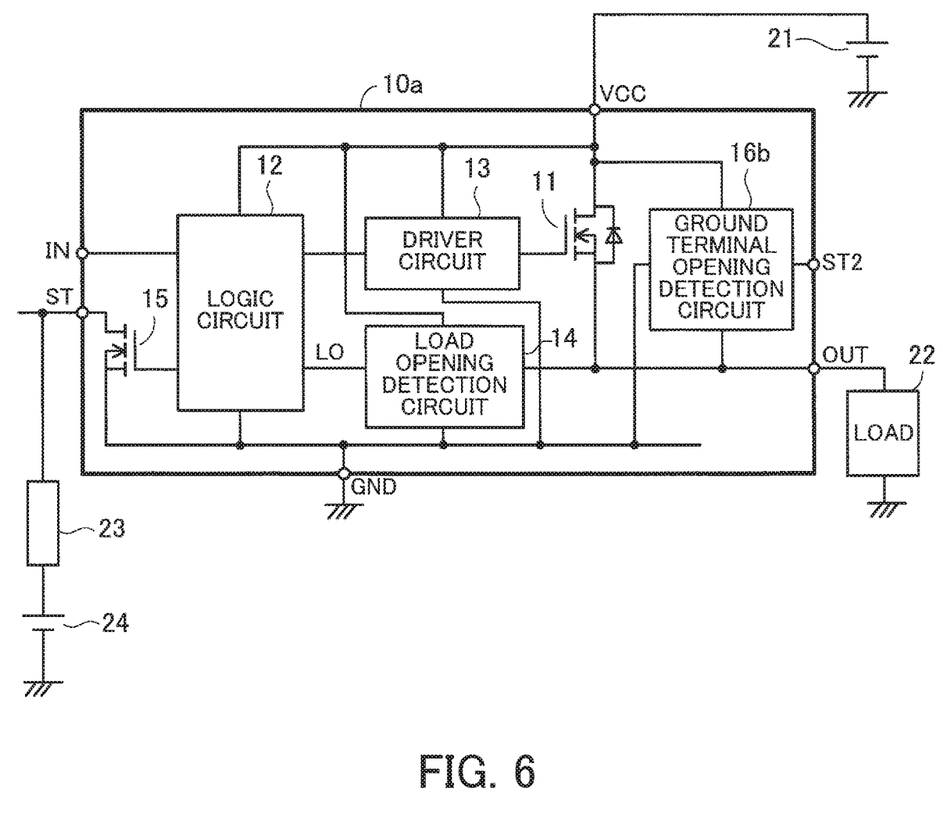
FIG. 6 illustrates an example of the structure of an IPS according to a third embodiment.
Figure 7:
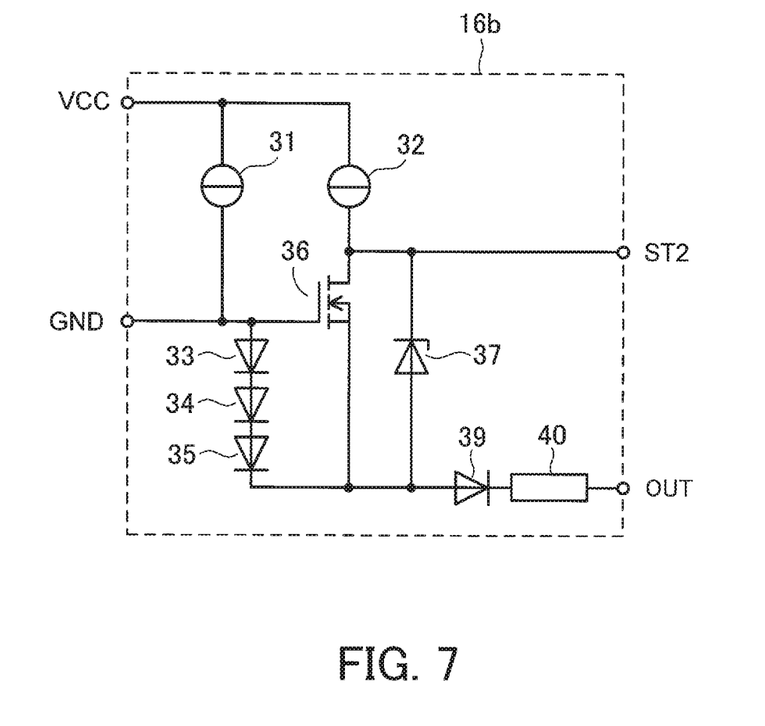
FIG. 7 is a circuit diagram illustrative of an example of the structure of a ground terminal opening detection circuit in the IPS according to the third embodiment.
Figure 8:
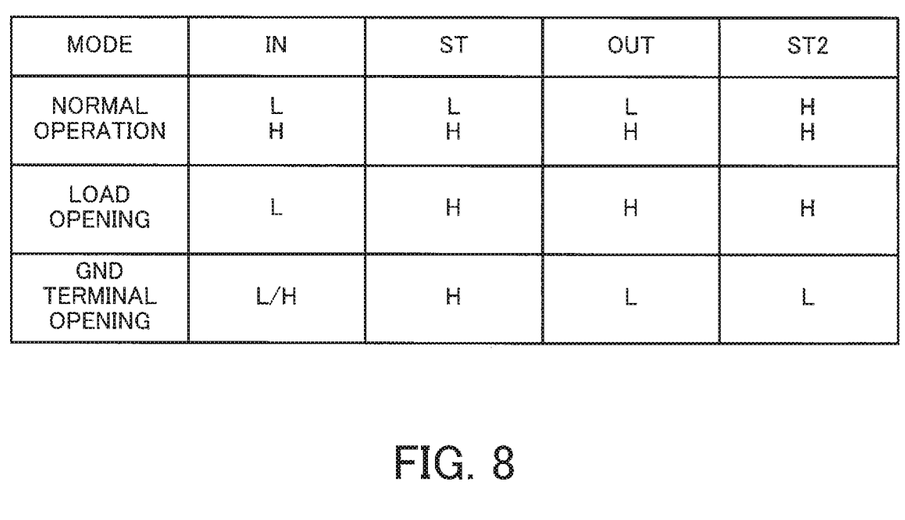
FIG. 8 is a logic table illustrative of the operation of the IPS according to the third embodiment.

FIG. 6 illustrates an example of the structure of an IPS according to a third embodiment. FIG. 7 is a circuit diagram illustrative of an example of the structure of a ground terminal opening detection circuit in the IPS according to the third embodiment. FIG. 8 is a logic table illustrative of the operation of the IPS according to the third embodiment. Components in FIGS. 6 and 7 which are the same as or equivalent to those illustrated in FIGS. 1 and 2 are marked with the same numerals and detailed descriptions of them will be omitted.

The IPS 10 according to the first embodiment or the IPS according to the second embodiment detects the ground terminal opening with the potential of the GND2 terminal as reference. On the other hand, an IPS 10a according to the third embodiment detects a ground terminal opening with the potential of an OUT terminal as reference.

As illustrated in FIG. 6, the IPS 10a according to the third embodiment includes a main MOSFET 11, a logic circuit 12, and a driver circuit 13 and includes a load opening detection circuit 14, a MOSFET 15, and a ground terminal opening detection circuit 16b as a state detection function. Furthermore, the IPS 10a includes an IN terminal, a VCC terminal, the OUT terminal, a GND terminal, an ST terminal, and an ST2 terminal.

A power source terminal, an input terminal, an output terminal, and a ground-side terminal of the ground terminal opening detection circuit 16b are connected to the VCC terminal, the GND terminal, the ST2 terminal, and the OUT terminal respectively.

A control-oriented microcomputer is connected to the IN terminal, the ST terminal, and a ST2 terminal, supplies to the IN terminal an input logic signal generated with the potential of the GND terminal as reference, receives from the ST terminal a detection signal generated with the potential of the GND terminal as reference, and receives from the ST2 terminal a detection signal generated with the potential of the OUT terminal as reference.

As illustrated in FIG. 7, the ground terminal opening detection circuit 16b includes constant-current circuits 31 and 32, diodes 33, 34, and 35, a MOSFET 36, a Zener diode 37, a diode 39, and a resistor 40. When the main MOSFET 11 is on-controlled, 13 V which is the voltage of a battery 21 is outputted to the OUT terminal. The diode 39 is used for protecting a circuit which detects a ground terminal opening against a high voltage at the OUT terminal. That is to say, the diode 39 is a reverse-current prevention diode. The resistor 40 is used for limiting a current flowing from the constant-current circuit 32, through the Zener diode 37 and the diode 39, to the OUT terminal. That is to say, the resistor 40 is a protection resistor.

With the IPS 10a including the ground terminal opening detection circuit 16b having the above structure, as illustrated in FIG. 8, the main MOSFET 11 is off-controlled when an L-level input logic signal is inputted to the IN terminal at the time of the normal operation of the IPS 10a. As a result, the OUT terminal is at an L level. At this time, the logic circuit 12 supplies an H-level signal to a gate terminal of the MOSFET 15 and the MOSFET 15 is on-controlled. Accordingly, the ST terminal is at an L level. In the ground terminal opening detection circuit 16b, the potential of the GND terminal is 0 V and the MOSFET 36 is off-controlled. As a result, the ST2 terminal is at an H level. The H level at the ST2 terminal at this time is as follows. The OUT terminal is at an L level. The potential of the ST2 terminal is higher than the potential of the OUT terminal by a voltage (approximately equal to 5 V) corresponding to the sum of the breakdown voltage of the Zener diode 37, the forward voltage of the diode 39, and a drop in voltage caused by the resistor 40.

When an H-level input logic signal is inputted to the IN terminal at the time of the normal operation of the IPS 10a, the main MOSFET 11 is on-controlled and a voltage VCC is applied to the OUT terminal. As a result, the OUT terminal becomes an H level. At this time, the logic circuit 12 supplies an L-level signal to the gate terminal of the MOSFET 15 and the MOSFET 15 is off-controlled. Accordingly, the ST terminal becomes an H level. In the ground terminal opening detection circuit 16b, the potential of the GND terminal is 0 V and the MOSFET 36 is off-controlled. The voltage VCC is outputted to the OUT terminal. As a result, the ST2 terminal is at an H level. The H level at the ST2 terminal at this time is as follows. Because the voltage of the OUT terminal is VCC, the voltage of the ST2 terminal is equal to the voltage VCC (approximately equal to 13 V).

Next, when an L-level input logic signal is inputted to the IN terminal of the IPS 10a and the load opening detection circuit 14 detects a load opening, the OUT terminal becomes an H level because a drop in potential by a load 22 does not take place. At this time, the logic circuit 12 supplies an L-level signal to the gate terminal of the MOSFET 15 and the MOSFET 15 is off-controlled. Accordingly, the ST terminal becomes an H level. In the ground terminal opening detection circuit 16b, the potential of the GND terminal is 0 V and the MOSFET 36 is off-controlled. As a result, the ST2 terminal remains at the H level (approximately equal to 13 V).

Next, when the GND terminal is opened, the logic circuit 12 does not normally operate because the GND terminal is floating. Therefore, the main MOSFET 11 is put into an off state regardless of a level of a signal at the IN terminal and the OUT terminal becomes an L level (=0 V). In the ground terminal opening detection circuit 16b, the MOSFET 36 is on-controlled because the potential of a gate terminal of the MOSFET 36 is pulled up by the constant-current circuit 31. As a result, the Zener diode 37 is short-circuited by the MOSFET 36. Therefore, the ST2 terminal becomes an L level. When the OUT terminal is at the L level (=0 V), a voltage corresponding to the sum of the forward voltage of the diode 39 and a drop in voltage by the resistor 40 caused by the constant-current circuit 32 is outputted to the ST2 terminal and has a value close to 0 V. That is to say, the ST2 terminal is at an L level. When a GND terminal opening is detected, the ST terminal is at an H level. This is the same with the case where the load opening is detected. However, the ST2 terminal is at the H level at the time of the load opening being detected and is at the L level at the time of the GND terminal opening being detected. As a result, the microcomputer is capable of making a distinction between the load opening and the GND terminal opening and recognize the GND terminal opening.

The embodiments have been described. However, the present invention is not limited to these specific embodiments. It is a matter of course that various changes or modifications can be made without departing from the spirit of the present invention.

With the semiconductor device having the above structure, a detection signal is outputted to a status output terminal when a ground terminal opening detection circuit detects a state in which a ground terminal is opened. As a result, a microcomputer makes a distinction between this detection signal and another detection signal and recognizes this detection signal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device having a power source terminal, a ground terminal, a second ground terminal other than the ground terminal, an input terminal, an output terminal and a status output terminal, the semiconductor device comprising:
    a power semiconductor switch connected between the power source terminal and the output terminal;
    a logic circuit connected to the power semiconductor switch, the logic circuit being configured to generate, according to a signal inputted to the input terminal, an output logic signal for turning on or off the power semiconductor switch; and
    a ground terminal opening detection circuit connected to the ground terminal and the status output terminal, the ground terminal opening detection circuit being configured to detect a state in which the ground terminal is opened, based on a rise in a potential of the ground terminal, and to output, via the status output terminal, a detection signal in response to the detection of said state, wherein the ground terminal opening detection circuit includes:
        a pull-up circuit which is connected between the power source terminal and the ground terminal and which is configured to pull up the potential of the ground terminal;
        a switching element configured to be turned on by the potential of the ground terminal pulled up by the pull-up circuit in the state in which the ground terminal is opened;
        a constant-current source connected between the power source terminal and the switching element; and
        a Zener diode connected in parallel with the switching element, wherein
        the Zener diode has a cathode terminal connected to the status output terminal and an anode terminal connected to the second ground terminal.

2. The semiconductor device according to claim 1, wherein the ground terminal opening detection circuit includes a gate protection diode connected between a gate terminal of the switching element and the second ground terminal.

3. A semiconductor device having a power source terminal, a ground terminal, a second ground terminal other than the ground terminal, an input terminal, an output terminal and a status output terminal, the semiconductor device comprising:

a power semiconductor switch connected between the power source terminal and the output terminal;

a logic circuit connected to the power semiconductor switch, the logic circuit being configured to generate, according to a signal inputted to the input terminal, an output logic signal for turning on or off the power semiconductor switch; and a ground terminal opening detection circuit connected to the ground terminal and the status output terminal, the ground terminal opening detection circuit being configured to detect a state in which the ground terminal is opened, based on a rise in a potential of the ground terminal, and to output, via the status output terminal, a detection signal in response to the detection of said state, wherein the ground terminal opening detection circuit includes:

a pull-up circuit which is connected between the power source terminal and the ground terminal and which is configured to pull up the potential of the ground terminal;

a first switching element configured to be turned on by the potential of the ground terminal pulled up by the pull-up circuit in the state in which the ground terminal is opened;

a constant-current source connected between the power source terminal and the first switching element;

a Zener diode connected in parallel with the first switching element; and a second switching element configured to be turned off in response to the first switching element being on, wherein the second switching element has a first terminal, at a high potential side thereof, connected to the status output terminal, and a second terminal, at a low potential side thereof, connected to the second ground terminal, and the Zener diode has an anode terminal thereof connected to the second ground terminal.

4. The semiconductor device according to claim 3, wherein the ground terminal opening detection circuit includes a gate protection diode connected between a gate terminal of the first switching element and the second ground terminal.

5. A semiconductor device having a power source terminal, a ground terminal, an input terminal, an output terminal and a status output terminal, the semiconductor device comprising:

a power semiconductor switch connected between the power source terminal and the output terminal;

a logic circuit connected to the power semiconductor switch, the logic circuit being configured to generate, according to a signal inputted to the input terminal, an output logic signal for turning on or off the power semiconductor switch; and a ground terminal opening detection circuit connected to the ground terminal and the status output terminal, the ground terminal opening detection circuit being configured to detect a state in which the ground terminal is opened, based on a rise in a potential of the ground terminal, and to output, via the status output terminal, a detection signal in response to the detection of said state, wherein the ground terminal opening detection circuit includes:

a pull-up circuit which is connected between the power source terminal and the ground terminal and which is configured to pull up the potential of the ground terminal;

a switching element configured to be turned on by the potential of the ground terminal pulled up by the pull-up circuit in the state in which the ground terminal is opened;

a constant-current source connected between the power source terminal and the switching element;

a Zener diode connected in parallel with the switching element;

a reverse-current prevention diode having an anode terminal thereof connected to an anode terminal of the Zener diode; and a protection resistor having one terminal thereof connected to a cathode terminal of the reverse-current prevention diode, wherein the Zener diode has a cathode terminal thereof connected to the status output terminal, and the protection resistor has another terminal connected to the output terminal.

6. The semiconductor device according to claim 5, wherein the ground terminal opening detection circuit includes a gate protection diode connected between a gate terminal of the switching element and the anode terminal of the Zener diode.

7. The semiconductor device according to claim 1, wherein the pull-up circuit is a constant-current circuit.

8. A semiconductor device having a power source terminal, a ground terminal, an input terminal, an output terminal, a first status output terminal and a second status output terminal, the semiconductor device comprising:

a power semiconductor switch connected between the power source terminal and the output terminal, the power semiconductor switch being configured to supply power to a load via the output terminal;

a load opening detection circuit connected to the output terminal, the load opening detection circuit being configured to detect a load opening based on a potential of the output terminal;

a logic circuit connected to the power semiconductor switch and the first status output terminal, the logic circuit being configured to generate, according to a signal inputted to the input terminal, an output logic signal for turning on or off the power semiconductor switch, and to output, via the first status output terminal, a first detection signal in response to the detection of the load opening;

a ground terminal opening detection circuit connected to the ground terminal and the second status output terminal, the ground terminal opening detection circuit being configured to detect a state in which the ground terminal is opened, based on a rise in a potential of the ground terminal, and to output, via the second status output terminal, a second detection signal in response to the detection of the ground terminal opening; and a controller configured to make a distinction between the load opening and the ground terminal opening based on levels of the first detection signal and the second detection signal.

* * * * *